US007753458B2

(12) United States Patent
Liang et al.

(10) Patent No.: US 7,753,458 B2
(45) Date of Patent: Jul. 13, 2010

(54) EXPANSION CARD MOUNTING APPARATUS

(75) Inventors: Chun-Chi Liang, Tu-Cheng (TW); Hsuan-Tsung Chen, Tu-Cheng (TW); Ji-Guo Xu, Shenzhen (CN); Guang-Ming Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 937 days.

(21) Appl. No.: 11/494,103

(22) Filed: Jul. 27, 2006

(65) Prior Publication Data

US 2007/0030631 A1 Feb. 8, 2007

(30) Foreign Application Priority Data

Aug. 2, 2005 (CN) .................... 2005 2 0062551 U

(51) Int. Cl.
*A47B 81/00* (2006.01)
*H05K 7/16* (2006.01)

(52) U.S. Cl. .................... 312/223.2; 361/801; 361/740; 361/726

(58) Field of Classification Search .............. 312/265.5, 312/265.6, 223.2, 263, 257.1; 361/801, 759, 361/747, 732, 740, 726; 52/702; 248/227.1, 248/227.3, 312.1, 340

See application file for complete search history.

(56) References Cited

U.S. PATENT DOCUMENTS 4,745,524 A 5/1988 Patton, III
5,317,483 A 5/1994 Swindler
5,936,835 A 8/1999 Astier
6,231,139 B1 * 5/2001 Chen .................... 312/223.2
6,480,393 B1 * 11/2002 Chen .................... 361/759
6,552,913 B2 4/2003 Tournadre
6,693,800 B1 * 2/2004 Lin et al. .................... 361/759
6,704,205 B1 * 3/2004 Chen .................... 361/740
6,937,467 B2 * 8/2005 Hsu .................... 361/679.41
7,388,759 B2 * 6/2008 Chen et al. .................... 361/801
7,471,507 B2 * 12/2008 Huang .................... 361/679.55
7,522,423 B2 * 4/2009 Chen et al. .................... 361/728
2001/0053060 A1 * 12/2001 Gan .................... 361/683
2005/0135055 A1 * 6/2005 Wang et al. .................... 361/684
2007/0030660 A1 * 2/2007 Peng et al. .................... 361/801
2007/0081316 A1 * 4/2007 Peng et al. .................... 361/801
2007/0153492 A1 * 7/2007 Chen et al. .................... 361/801
2007/0153493 A1 * 7/2007 Chen et al. .................... 361/801

FOREIGN PATENT DOCUMENTS

DE 10128513 A1 * 2/2002

* cited by examiner

*Primary Examiner*—Janet M Wilkens
*Assistant Examiner*—Dan Rohrhoff
(74) *Attorney, Agent, or Firm*—Zhigang Ma

(57) ABSTRACT

A mounting apparatus for holding an expansion card with a slot cover, the mounting apparatus comprises a rear panel and a fastener. The rear panel defines a slot, and forms a holder above the slot. The holder forms a pivoting axis at a free end thereof, and the pivoting axis is in parallel with the rear panel. The fastener is pivotably attached to the pivoting axis, and comprises a pressing portion pressing the slot cover to the holder and a locking portion locked to the rear panel.

15 Claims, 5 Drawing Sheets

40 20 26 262 222 22 24 242 244 246 23 364 36 30 362 32 38 382 328 34 324 124 122 12 10

10
12
122
124
22
222
40
20
26
262
24
242
244
246
23
34
362
324
364
36
30
32
38
382
328

EXPANSION CARD MOUNTING APPARATUS

BACKGROUND OF THE INVENTION

1. Field of the Invention

The present invention relates to mounting apparatuses, and more particularly to a mounting apparatus for readily and securely mounting expansion cards in a computer enclosure.

2. General Background

Many computer systems comprise not only a motherboard, but also one or more expansion cards electrically connected to the motherboard to provide specialized functions. It is required that the expansion cards be reliably retained within the computer enclosure to prevent disengagement from the motherboard when the computer is subjected to shock and vibration during delivery and use thereof.

A conventional mounting apparatus includes a pressing body having one end pivotably mounted to a support plate of the chassis. After the pressing body is pivoted to a position in which slot covers of the expansion cards are sandwiched between the pressing body and the support plate, the other end of the pressing body is fastened to the support plate with a screw. The expansion cards are thus secured to chassis.

Another conventional mounting apparatus has a plurality of spring fingers and a mounting portion. After the mounting apparatus is disposed in a position in which the spring fingers respectively press corresponding slot covers of expansion cards, the mounting portion is screwed to the chassis. The expansion cards are thus secured to the chassis.

Both of the above-mentioned apparatuses can mount a plurality of expansion cards at one time. However, when installing or removing several expansion cards, manipulating the screw is unduly laborious and time-consuming. In addition, a tool such as a screwdriver or a wrench is usually required.

What is desired, therefore, is a mounting apparatus which conveniently and securely locks an expansion card in a computer enclosure.

SUMMARY

In one preferred embodiment, a mounting apparatus for holding an expansion card with a slot cover is provided. The mounting apparatus comprises a rear panel and a fastener. The rear panel defines a slot, and forms a holder above the slot. The holder forms a pivoting axis from a free end thereof, and the pivoting axis is parallel with the rear panel. The fastener is pivotably attached to the pivoting axis, and comprises a pressing portion pressing the slot cover to the holder and a locking portion locked to the rear panel.

Other advantages and novel features will become more apparent from the following detailed description of preferred embodiments when taken in conjunction with the accompanying drawings, in which:

DETAILED DESCRIPTION OF THE EMBODIMENTS

Figure 1:
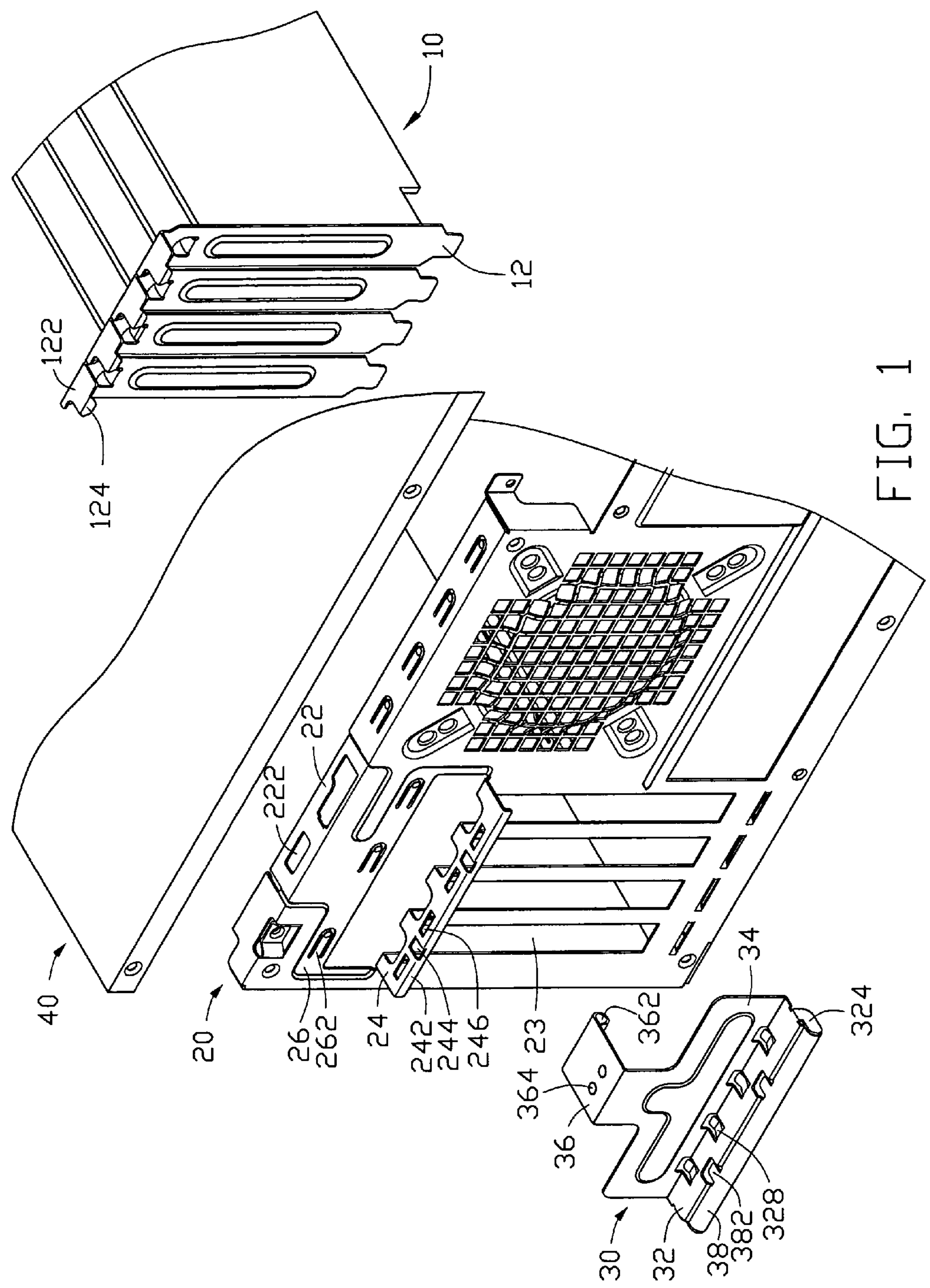
FIG. 1 is an exploded, isometric view of a mounting apparatus in accordance with a preferred embodiment of the present invention, with a plurality of expansion cards, the mounting apparatus including a rear panel and a fastener.

Referring to FIG. 1, in a preferred embodiment of the invention, a mounting apparatus is provided for holding a plurality of functional components like expansion cards 10 to an enclosure of an electronic device like a computer. The mounting apparatus includes a rear panel 20 and a fastener 30. A slot cover 12 is attached to an end of each expansion card 10. Each slot cover 12 includes a bent end portion 122 with an insertion end 124 extending therefrom.

A flange 22 defining a locking hole 222 therein is formed from an edge of the rear panel 20. A plurality of expansion slots 23 are defined in the rear panel 20, and a holder 24 is formed from the rear panel 20 above the expansion slots 23. A pivoting axis 242 is formed from a free end of the holder 24, in parallel with the rear panel 20. Two mounting holes 244 are defined in the holder 24 near the pivoting axis 242. A plurality of insert holes 246 is defined in the holder 24 in parallel with the pivoting axis 242. The rear panel 20 defines a recessed portion 26 above the holder 24, and a plurality of elastic fingers 262 are formed on the recessed portion 26 to resist against the fastener 30. The recessed portion 26 is provided so that when the fastener 30 is in a locked state an exposed side of the fastener 30 is flush with exterior surfaces of the rear panel 20.

Figure 2:
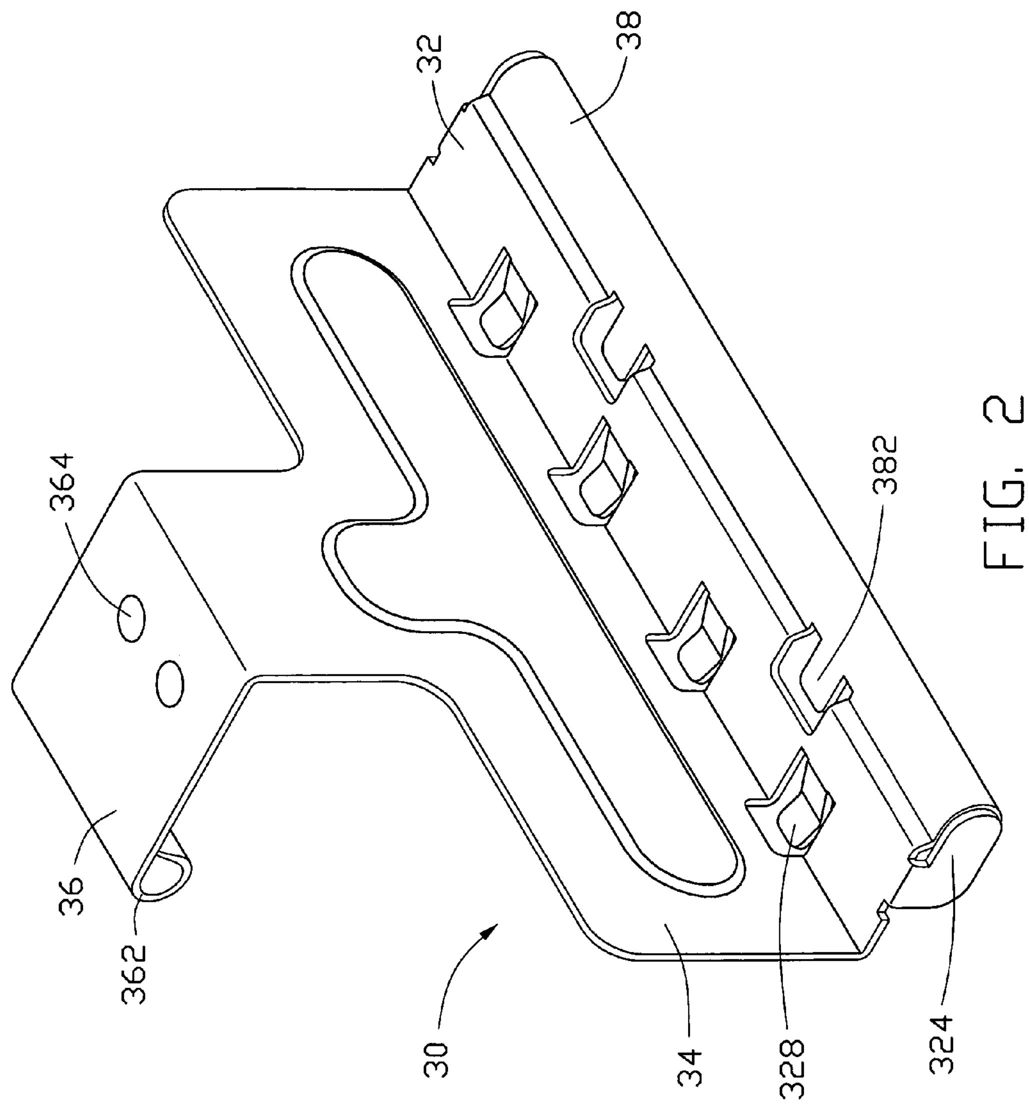
FIG. 2 is an enlarged view of the fastener of the mounting apparatus of FIG. 1.
Figure 3:
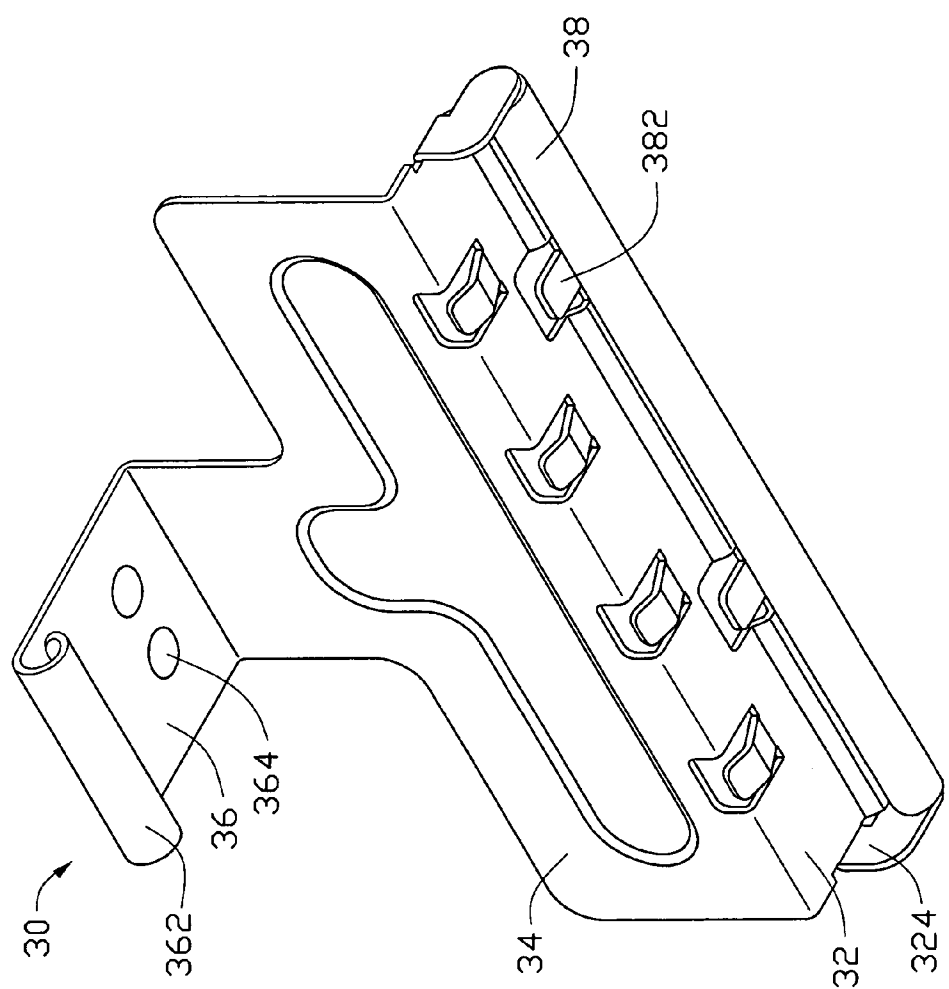
FIG. 3 is an enlarged inverted view of the fastener of the mounting apparatus of FIG. 1.

Referring also to FIG. 2 and FIG. 3, in this embodiment the fastener 30 is made of metal. The fastener 30 includes a pressing portion 32, a connecting portion 34 extends perpendicularly from a side of the pressing portion 32, an arcuate pivoting portion 38 extends from an opposite side of the pressing portion 32, and a locking portion 36 extends perpendicularly from a free side of the connecting portion 34. Two holding tabs 382 corresponding to the mounting holes 244 extend out from the pivoting portion 38 near the pressing portion 32. A pair of locating pieces 324 extends down from two opposite ends of the pressing portion 32. A plurality of V-shaped cantilevered pressing sections 328 for pressing the expansion cards 10 extend out from the pressing portion 32 near the connecting portion 34. A distal end of the locking portion 36 is rolled to form a handle 362. Two mounting sections are extruded from the locking portion 36, and the mounting sections are two protrusions 364.

Figure 4:
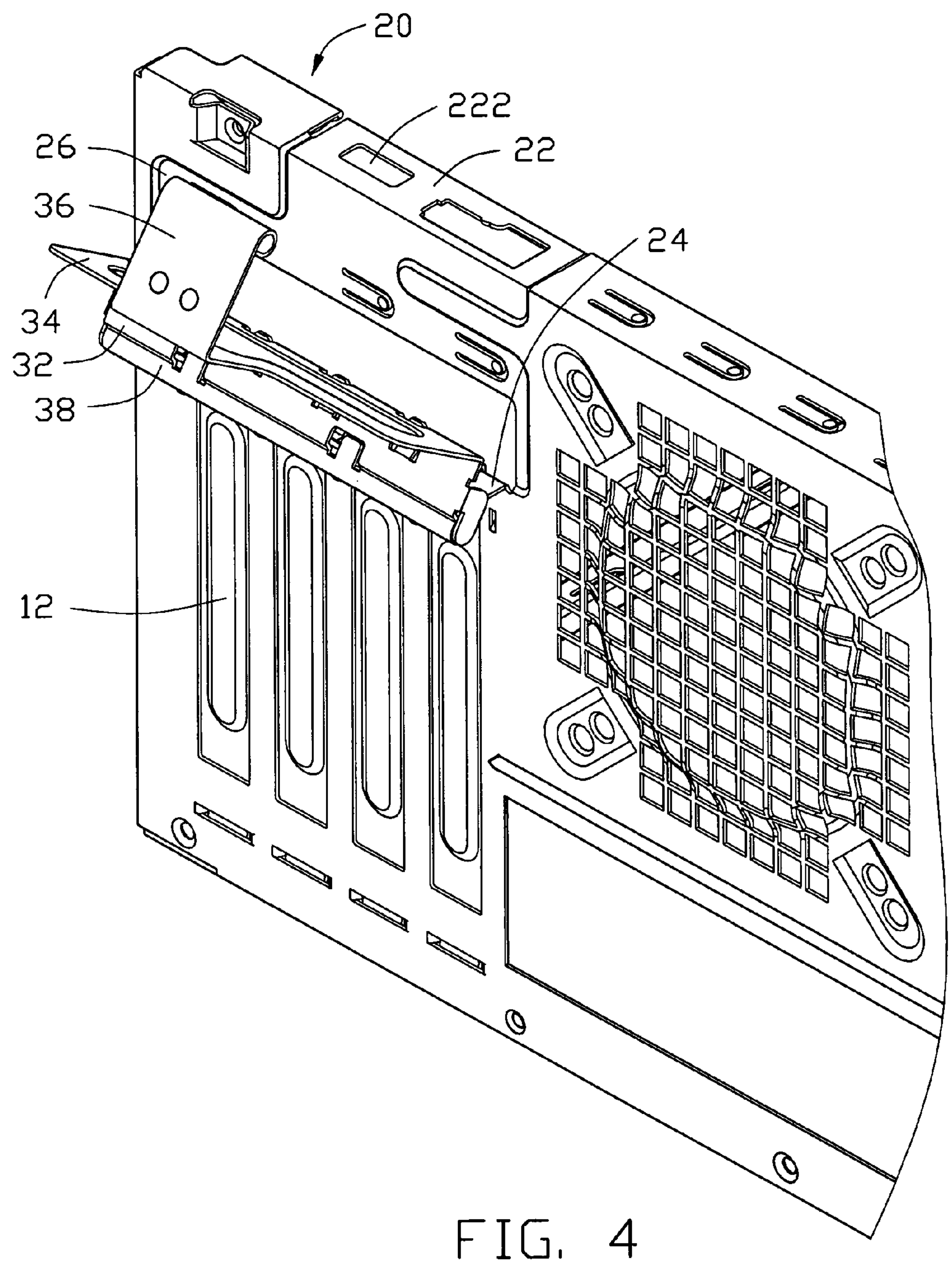
FIG. 4 is an assembled view of FIG. 1, showing an unlocked state.
Figure 5:
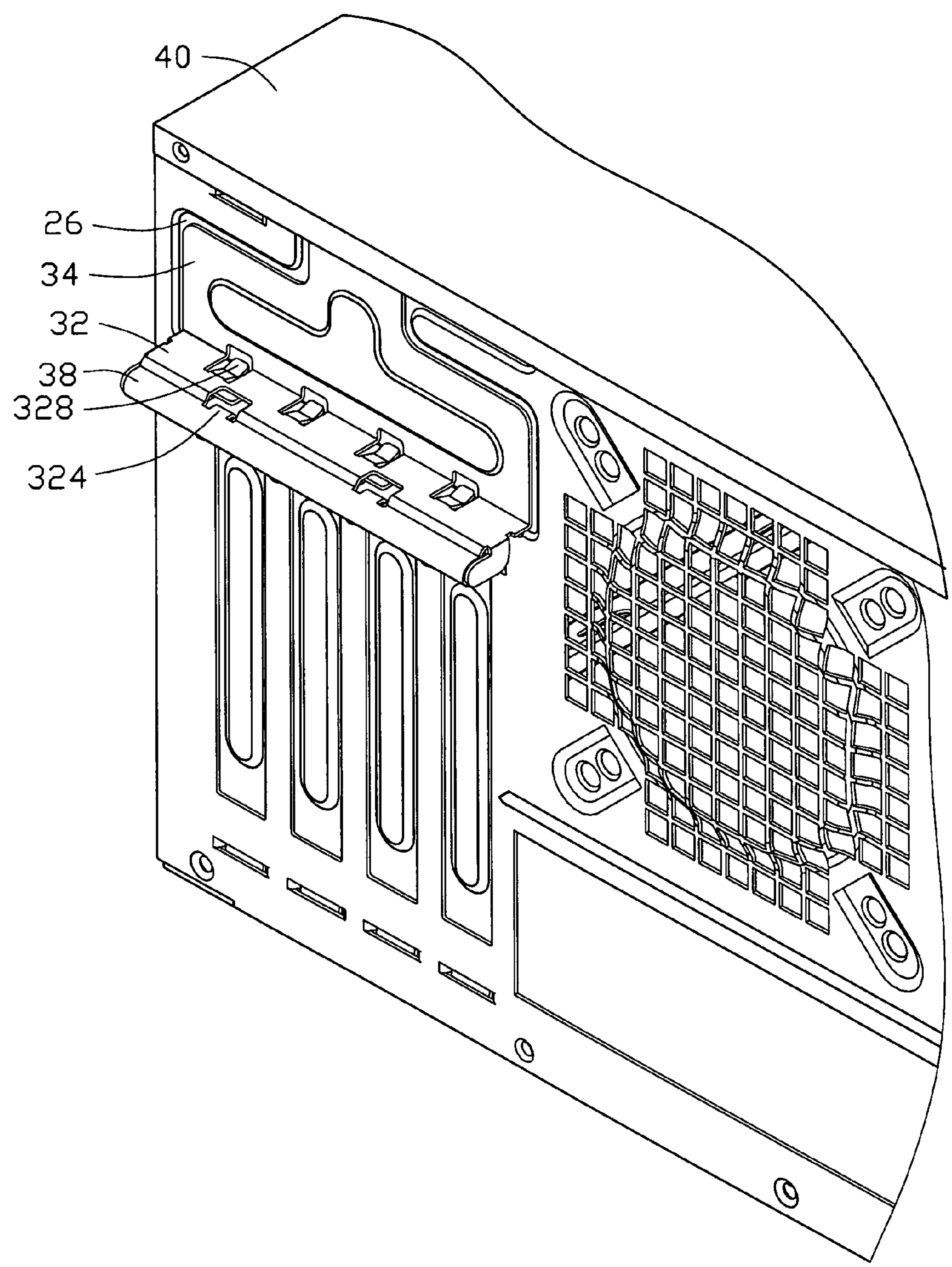
FIG. 5 is an assembled view of FIG. 1, showing a locked state.

Referring also to FIG. 4 and FIG. 5, in assembly, the pivoting portion 38 of the fastener 30 is joined with the pivoting axis 242 of the holder 24, and the pivoting axis 242 of the holder 24 is received and enclosed by the pivoting portion 38. The holding tabs 382 of the pivoting portion 38 are bent until they pass through the mounting holes 244 respectively to engage a free side of the pivoting portion 38, thus the fastener 30 is pivotably attached to the pivoting axis 242 of the holder 24.

The slot covers 12 of the expansion cards 10 are put into the slots 23 of the rear panel 20, and the bent end portions 122 are retained on the holder 24. The insertion ends 124 are inserted into the insert holes 246 respectively. The fastener 30 is pivoted toward the rear panel 20 until the locking portion 36 is locked to the flange 22 of the rear panel 20, and the protrusions 364 of the locking portion 36 engage in the locking hole 222 of the flange 22 for locating the fastener 30. Further, the rolled handle 362 slightly deforms and then rebounds to snappingly engage with a far side of the flange 22. A cover 40 covers the computer enclosure, and retains the locking portion 36 of the fastener 30 on the flange 22 of the rear panel 20. Thus the slot covers 12 of the expansion cards 10 are pressed firmly against the holder 24 by the pressing portion 32 of the fastener 30. The connecting portion 34 of the fastener 30 is disposed in the recessed portion 26 of the rear panel 20, and presses the elastic fingers 262 of the recessed portion 26. The resistance from the elastic fingers 262 against the fastener 30 ensures a snug fit between the protrusions 364 and the locking hole 222 and the rolled handle 362 and the far side of the flange 22, thus preventing vibration of the fastener 30. Thus, the expansion cards 10 are mounted to the computer enclosure.

To detach the expansion cards 10 from the rear panel 20, the cover 40 is taken away from the computer enclosure, and the handle 362 of the locking portion 36 is pulled away from the flange 22. The fastener 30 is rotated round the pivoting axis 242 of the holder away from the rear panel 20 until the pressing portion 32 of the fastener 30 is separated from the slot covers 12 of the expansion cards 10. Thus the expansion cards 10 are easily taken out from the rear panel 20.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A mounting apparatus for holding an expansion card with a slot cover, the mounting apparatus comprising:

a rear panel defining a slot and forming a cantilevered holder which is bent from the rear panel above the slot and has a free end distal from a portion from which the holder is bent, the free end of the holder acting as a pivoting axis, and the pivoting axis being in parallel with the rear panel; and a fastener pivotably attached to the pivoting axis, comprising a pressing portion adapted to press the slot cover to the holder and a locking portion locked to the rear panel;

wherein the fastener further comprises a pivoting portion extending from the pressing portion, the holder defines a mounting hole in the vicinity of the pivoting axis, and the pivoting portion of the fastener forms a holding tab to be bent into the mounting hole to trap the pivoting axis in the pivoting portion.

2. The mounting apparatus as claimed in claim 1, further comprising a cover pressing the locking portion to the rear panel.

3. The mounting apparatus as claimed in claim 1, wherein the pressing portion forms two locating pieces covering two opposite ends of the pivoting portion.

4. The mounting apparatus as claimed in claim 1, wherein the rear panel is bent to form a flange, and the locking portion of the fastener forms a mounting section locking to the flange of the rear panel.

5. The mounting apparatus as claimed in claim 4, wherein the flange of the rear panel defines a locking hole, and the mounting section is a protrusion snappingly engaging in the locking hole.

6. The mounting apparatus as claimed in claim 1, wherein a distal end of the locking portion of the fastener is rolled to form a handle.

7. The mounting apparatus as claimed in claim 1, wherein the fastener comprises a connecting portion connecting the pressing portion to the locking portion, and the rear panel defines a recessed portion for receiving the connecting portion.

8. The mounting apparatus as claimed in claim 7, wherein the recessed portion forms a plurality of elastic fingers pressing the connecting portion of the fastener.

9. The mounting apparatus as claimed in claim 1, wherein the pressing portion of the fastener forms a resilient pressing section pressing against the slot cover of the expansion card.

10. The mounting apparatus as claimed in claim 1, wherein the holder defines an insert hole, and the slot cover of the expansion card forms an insertion end inserting into the insert hole.

11. The mounting apparatus as claimed in claim 1, wherein an insert hole is defined in the holder in parallel with the pivoting axis for the slot cover of the expansion card engaging therein.

12. A mounting apparatus for holding a plurality of expansion cards, the mounting apparatus comprising:

a adapted to be slot cover attached to each of the expansion cards;

a rear panel defining a plurality of slots and forming a holder above the slots, the holder defining a mounting hole in the vicinity of a distal end thereof; and a fastener comprising a curved pivoting end, a locking end and a pressing portion between the pivoting end and the locking end, the pivoting end extending from the pressing portion and having a free end under the pressing portion, a holding tab extending from a junction of the pressing portion and the pivoting end toward the pressing portion, and being bendable into the mounting hole toward the free end of the pivoting end to enclose the distal end of the holder, thus the pivoting end is pivotably attached to the holder, the fastener being pivotable toward the rear panel, and the pressing portion pressing the slot cover to the holder and the locking end locking to the rear panel.

13. An electronic device comprising:

an enclosure comprising a rear panel extending along a side thereof, said rear panel defining a plurality of slots, and a holder extending from said rear panel outside said enclosure beside said plurality of slots, said holder defining a pivoting axis thereat spaced from said rear panel;

a component with a slot cover attachable thereto installable in said enclosure for function extension of said electronic device, said slot cover configured to be placed against said holder of said rear panel and cover a selective one of said plurality of slots when said component is functionally installed in said enclosure; and a fastener removably attachable to said rear panel beside said plurality of slots and pivotally movable about said pivoting axis of said holder by means of abutting against said pivoting axis to pivotally move to a final position of said fastener where said fastener urges said slot cover against said holder in order to retain said component in said enclosure;

wherein the fastener further comprises a pivoting portion extending from a pressing portion, the holder defines a mounting hole in the vicinity of the pivoting axis, and the pivoting portion of the fastener forms a holding tab to be bent into the mounting hole to trap the pivoting axis in the pivoting portion.

14. The electronic device as claimed in claim 13, wherein said fastener comprises a pivoting portion to receivably enclose said pivoting axis of said holder therein and to abut against said pivoting axis for pivotal movement of said fastener about said pivoting axis.

15. The mounting apparatus as claimed in claim 13, wherein the slot cover of the component comprises a bent end portion extending perpendicularly from a side of the slot cover, an insertion end extends perpendicularly from a side of the bent end portion in parallel with the slot cover, an insert hole is defined in the holder in parallel with the pivoting axis for the insertion end of the expansion card engaging therein.

* * * * *